United States Patent
Kim et al.

(10) Patent No.: US 9,391,158 B2
(45) Date of Patent: Jul. 12, 2016

(54) METHOD OF FABRICATING SEMICONDUCTOR DEVICE HAVING HIGH-K GATE INSULATION FILMS INCLUDING WORK FUNCTION ADJUSTING MATERIAL

(71) Applicant: Samsung Electronics Co., Ltd., Suwon-si (KR)

(72) Inventors: Ju-Youn Kim, Suwon-si (KR); Young-Hun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/728,018

(22) Filed: Jun. 2, 2015

(65) Prior Publication Data

US 2015/0325670 A1   Nov. 12, 2015

Related U.S. Application Data

(62) Division of application No. 13/833,153, filed on Mar. 15, 2013, now Pat. No. 9,076,669.

(30) Foreign Application Priority Data

May 14, 2012   (KR) .................. 10-2012-0051041

(51) Int. Cl.
| | |
|---|---|
| H01L 29/51 | (2006.01) |
| H01L 27/088 | (2006.01) |
| H01L 21/02 | (2006.01) |
| H01L 29/49 | (2006.01) |
| H01L 21/28 | (2006.01) |
| H01L 27/11 | (2006.01) |
| H01L 21/8238 | (2006.01) |
| H01L 27/092 | (2006.01) |
| H01L 29/78 | (2006.01) |

(52) U.S. Cl.
CPC .............. *H01L 29/517* (2013.01); *H01L 21/02* (2013.01); *H01L 21/28088* (2013.01); *H01L 21/28167* (2013.01); *H01L 21/28194* (2013.01); *H01L 21/823857* (2013.01); *H01L 27/088* (2013.01); *H01L 27/092* (2013.01); *H01L 27/1104* (2013.01); *H01L 29/4966* (2013.01); *H01L 29/513* (2013.01); *H01L 29/78* (2013.01)

(58) Field of Classification Search
None
See application file for complete search history.

(56) References Cited

U.S. PATENT DOCUMENTS

| | | | |
|---|---|---|---|
| 7,396,675 B2 | 7/2008 | Pawlak et al. | |
| 7,952,118 B2 | 5/2011 | Jung et al. | |

(Continued)

FOREIGN PATENT DOCUMENTS

| | | |
|---|---|---|
| JP | 2009-152303 | 7/2009 |
| JP | 2010-206099 | 9/2010 |

*Primary Examiner* — Bilkis Jahan
(74) *Attorney, Agent, or Firm* — Myers Bigel & Sibley, P.A.

(57) ABSTRACT

A semiconductor device having high-k gate insulation films and a method of fabricating the semiconductor device are provided. The semiconductor device includes a first gate insulation film on a substrate and the first gate insulation film includes a material selected from the group consisting of $HfO_2$, $ZrO_2$, $Ta_2O_5$, $TiO_2$, $SrTiO_3$ and $(Ba,Sr)TiO_3$, and lanthanum (La). Additionally, the semiconductor device includes a first barrier film on the first gate insulation film, a first gate electrode on the first barrier film, and n-type source/drain regions in the substrate at both sides of the first gate electrode.

12 Claims, 5 Drawing Sheets

(56) References Cited

U.S. PATENT DOCUMENTS

| | | |
|---|---|---|
| 7,994,591 B2 | 8/2011 | Shin |
| 8,022,486 B2 | 9/2011 | Sekine et al. |
| 2008/0150003 A1 | 6/2008 | Chen et al. |
| 2009/0212351 A1 | 8/2009 | Chen |
| 2010/0006145 A1 | 1/2010 | Lee |
| 2010/0006926 A1* | 1/2010 | Zhu ................. H01L 21/823842 257/327 |
| 2010/0133623 A1 | 6/2010 | Inumiya et al. |
| 2010/0193883 A1* | 8/2010 | Hase ................. H01L 21/28097 257/411 |
| 2010/0203704 A1 | 8/2010 | Inumiya et al. |
| 2010/0301427 A1* | 12/2010 | Lenski ............. H01L 21/28088 257/392 |
| 2010/0301429 A1 | 12/2010 | Nabatame |
| 2011/0062561 A1 | 3/2011 | Akiyama et al. |
| 2011/0215413 A1 | 9/2011 | Ikeno |
| 2011/0266629 A1 | 11/2011 | Ogawa et al. |
| 2012/0129327 A1* | 5/2012 | Lee ..................... H01L 21/2254 438/548 |
| 2013/0105906 A1* | 5/2013 | Yin ................. H01L 21/823842 257/369 |
| 2013/0256803 A1* | 10/2013 | Clark ............. H01L 21/823842 257/368 |
| 2013/0295738 A1* | 11/2013 | Kuo ................. H01L 29/66795 438/283 |

* cited by examiner

METHOD OF FABRICATING SEMICONDUCTOR DEVICE HAVING HIGH-K GATE INSULATION FILMS INCLUDING WORK FUNCTION ADJUSTING MATERIAL

CROSS-REFERENCE TO RELATED APPLICATION

This application is a divisional of U.S. patent application Ser. No. 13/833,153, filed Mar. 15, 2013, which claims priority under 35 U.S.C. §119 to Korean Patent Application No. 10-2012-0051041 filed on May 14, 2012, in the Korean Intellectual Property Office, and the benefit accruing therefrom under 35 U.S.C. §119. The disclosures of the above referenced applications are hereby incorporated by reference herein in their entireties.

FIELD

The present disclosure generally relates to the field of electronics, and more particular to a semiconductor device.

BACKGROUND

As a size of a MOS transistor is reduced, maintaining appropriate capacitance between the gate and the channel while avoiding direct tunneling current through the gate insulation film is a problem. Especially, where a silicon oxide film is used as the gate insulation film, the silicon oxide film should be thin enough for appropriate capacitance but the thin silicon oxide film may result in direct tunneling current.

Therefore, a high-k film having a high dielectric constant (k) is sometimes used as a gate insulation film because it allows maintaining the capacitance between the gate and the channel with a relatively thick layer.

SUMMARY

A semiconductor device may include a first gate insulation film on a substrate and the first gate insulation film may include a first material selected from the group consisting of $HfO_2$, $ZrO_2$, $Ta_2O_5$, $TiO_2$, $SrTiO_3$ and $(Ba,Sr)TiO_3$. The semiconductor device may further include a first barrier film on the first gate insulation film and the first barrier film may include a second material selected from the group consisting of HfON, HfSiON, ZrON and ZrSiON. The semiconductor device may also include a first gate electrode on the first barrier film and n-type source/drain regions in the substrate at both sides of the first gate electrode. In the semiconductor device, lanthanum (La) may be included in the first gate insulation film.

In various embodiments, the first barrier film may be free of La.

According to various embodiments, the first gate insulation film may be free of aluminum (Al).

In various embodiments, the semiconductor device may additionally include a second gate insulation film on the substrate and the second gate insulation film may include a third material selected from the group consisting of $HfO_2$, $ZrO_2$, $Ta_2O_5$, $TiO_2$, $SrTiO_3$ and $(Ba,Sr)TiO_3$. The semiconductor device may further include a second barrier film on the second gate insulation film and the second barrier film may include a fourth material selected from the group consisting of HfON, HfSiON, ZrON and ZrSiON. The semiconductor device may also include a second gate electrode on the second barrier film and p-type source/drain regions in the substrate at both sides of the second gate electrode.

In various embodiments, Al may be included in the second gate insulation film.

According to various embodiments, the second barrier film may be free of Al.

In various embodiments, the semiconductor device may further include an interface film between the substrate and the first gate insulation film.

A semiconductor device may include a substrate having a first region and a second region. The semiconductor device may further include an NMOS transistor in the first region and the NMOS transistor may include a first $HfO_2$ film, a first HfSiON film on the first $HfO_2$ film, a first gate electrode on the first HfSiON film, and n-type source/drain regions in the substrate at both sides of the first gate electrode. The semiconductor device may also include a PMOS transistor in the second region and the PMOS transistor may include a second $HfO_2$ film, a second HfSiON film on the second $HfO_2$ film, a second gate electrode on the second HfSiON film, and p-type source/drain regions in the substrate at both sides of the second gate electrode. The first $HfO_2$ film may include lanthanum (La) but the second $HfO_2$ film may be free of La, and the second $HfO_2$ film may include aluminum (Al) but the first $HfO_2$ film may be free of Al.

In various embodiments, the first HfSiON film may be free of La.

According to various embodiments, the second HfSiON film may be free of Al.

A method of fabricating a semiconductor device may include providing a substrate having a first region and a second region. The method may further include forming a first insulation film on the substrate using one selected from the group consisting of $HfO_2$, $ZrO_2$, $Ta_2O_5$, $TiO_2$, $SrTiO_3$ and $(Ba,Sr)TiO_3$. The method may also include forming a second work function adjusting layer including a second material on the first insulation film in the second region while avoiding forming the second work function adjusting layer on the first insulation film in the first region. Moreover, the method may include forming a first work function adjusting layer including a first material on the first insulation film in the first region and on the second work function adjusting layer in the second region. Additionally, the method may include diffusing the first material and the second material into the first insulation film by annealing, removing the first work function adjusting layer and the second work function adjusting layer to expose the first insulation film and forming a second insulation film on the first insulation film using one selected from the group consisting of HfON, HfSiON, ZrON and ZrSiON.

In various embodiments, the second material in the second work function adjusting layer may include Al.

According to various embodiments, forming the second work function adjusting layer may include sequentially stacking a lower TiN film, an Al film and an upper TiN film.

In various embodiments, the first material in the first work function adjusting layer may include La.

According to various embodiments, forming the first work function adjusting layer may include sequentially stacking a LaO film and a TiN film.

A semiconductor device may include a first gate insulation layer on a substrate and the first gate insulation layer may include a first high-k oxide and lanthanum (La). The semiconductor device may further include a first barrier layer on the first gate insulation layer. The semiconductor device may also include a first gate electrode on the first barrier layer and n-type source/drain regions in the substrate at both sides of the first gate electrode.

In various embodiments, the first barrier layer may be free of La.

According to various embodiments, the first gate insulation layer may be free of aluminum (Al).

In various embodiments, the first high-k oxide may be a material selected from the group consisting of HfO2, ZrO2, Ta2O5, TiO2, SrTiO3 and (Ba,Sr)TiO3.

According to various embodiments, the semiconductor device may further include a second gate insulation layer on the substrate and the second gate insulation layer may include a second high-k oxide and Al. Moreover, the semiconductor device may include a second barrier layer on the second gate insulation layer, a second gate electrode on the second barrier layer and p-type source/drain regions in the substrate at both sides of the second gate electrode.

In various embodiments, the second barrier layer may be free of Al.

According to various embodiments, the second gate insulation layer may be free of La.

In various embodiments, the first high-k oxide and the second high-k oxide may be identical.

DETAILED DESCRIPTION OF THE EMBODIMENTS

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing. For example, an implanted region illustrated as a rectangle may have rounded or curved features and/or a gradient of implant concentration at its edges rather than a binary change from implanted to non-implanted region.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Figure 1:
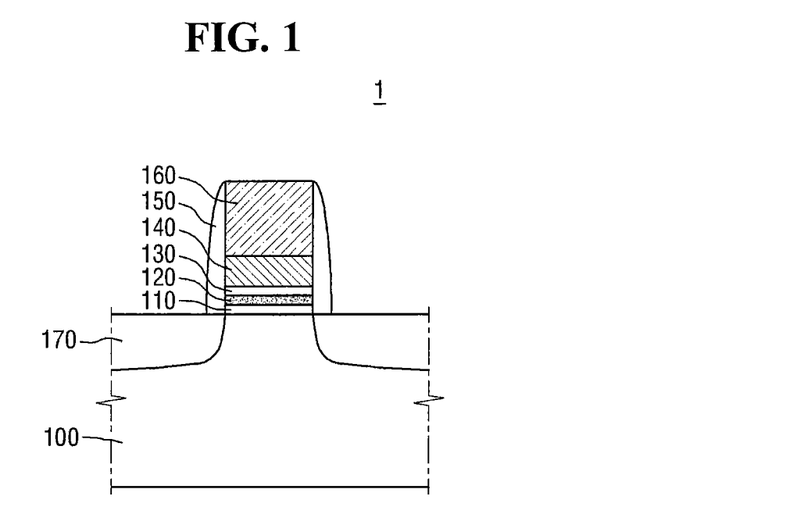
FIG. 1 is a cross-sectional view of a semiconductor device according to some embodiments of the inventive concept.

FIG. 1 is a cross-sectional view of a semiconductor device according to some embodiments of the inventive concept. The semiconductor device shown in FIG. 1 is an NMOS transistor, but aspects of the inventive concept are not limited thereto.

Referring to FIG. 1, the semiconductor device 1 may include a substrate 100, a first interface film 110, a first gate insulation film 120, a first barrier film 130, first gate electrodes 140 and 160, a first spacer 150, and a first source/drain 170.

The substrate 100 may include a silicon substrate, a gallium arsenic substrate, a silicon germanium substrate, a ceramic substrate, a quartz substrate, a glass substrate for display, or a semiconductor on insulator (SOI) substrate. In addition, the substrate 100 may be of, for example, a first conductivity (P) type, but aspects of the inventive concept are not limited thereto.

The first interface film 110 may reduces interface defects between the substrate 100 and the first gate insulation film 120. The first interface film 110 may include a low dielectric constant material layer having a dielectric constant (k) of 9 or less, for example, a silicon oxide film (having k of about 4) or a silicon oxynitride film (having k in a range of about 4 to 8 according to contents of oxygen and nitrogen atoms). Alternatively, the first interface film 110 may be made of silicate, and combinations of the films illustrated herein.

The first gate insulation film 120 may be formed on the first interface film 110 and may be a high-k film made of a material selected from the group consisting of $HfO_2$, $ZrO_2$, $Ta_2O_5$, $TiO_2$, $SrTiO_3$ and $(Ba,Sr)TiO_3$. The first gate insulation film 120 may be formed to an appropriate thickness according to the kind of device to be fabricated. For example, in a case where the first gate insulation film 120 is a $HfO_2$ film, it may have a thickness of about 50 Å or less, specifically in a range of about 5 to about 50 Å.

The first barrier film 130 may be formed on the first gate insulation film 120 and may be made of a material selected from the group consisting of HfON, HfSiON, ZrON and ZrSiON. For example, in a case where the first gate insulation film 120 is an $HfO_2$ film, the first barrier film 130 may be an HfSiON film. The first barrier film 130 reduces the penetration of impurities included in the first gate electrodes 140 and 160. The first barrier film 130 may be formed to an appropriate thickness according to the kind of device to be fabricated. The first barrier film 130 may have a thickness of, for example, about 5 to about 25 Å.

The first gate electrodes 140 and 160 are formed on the first barrier film 130. As shown, the first gate electrodes 140 and 160 may include a stacked structure of a metal electrode 140 and a silicon electrode 160, but aspects of the inventive concept are not limited thereto. The metal electrode 140 may be made of a variety of materials, for example, TiN.

The first spacer 150 may be formed on lateral surfaces of the first interface film 110, the first gate insulation film 120, the first barrier film 130, and the first gate electrodes 140 and 160. The first spacer 150 may include one of SiN and SiON.

The first source/drain 170 may be disposed at both sides of the first gate electrodes 140 and 160 in the substrate 100. The first source/drain 170 may be an n-type source/drain doped with n-type impurity. The first source/drain 170 may have a low doped drain (LDD) shape, but aspects of the inventive concept are not limited thereto. The shape of the first source/drain 170 may vary according to the kind of device to be fabricated.

In the semiconductor device 1 according to an embodiment of the inventive concept, lanthanum (La) may be included in the first gate insulation film 120. In addition, La may not be included in the first barrier film 130. La adjusts a work function of an NMOS transistor and a threshold voltage (Vt). In a case where La is included in the first barrier film 130, there is an increased possibility of occurrence of leakage current. Therefore, La may be included in the first gate insulation film 120 while not included in the first barrier film 130. Accordingly, in the semiconductor device 1 according to an embodiment of the inventive concept, a narrow channel effect and leakage current can be reduced while maximizing channel mobility.

Figure 2:
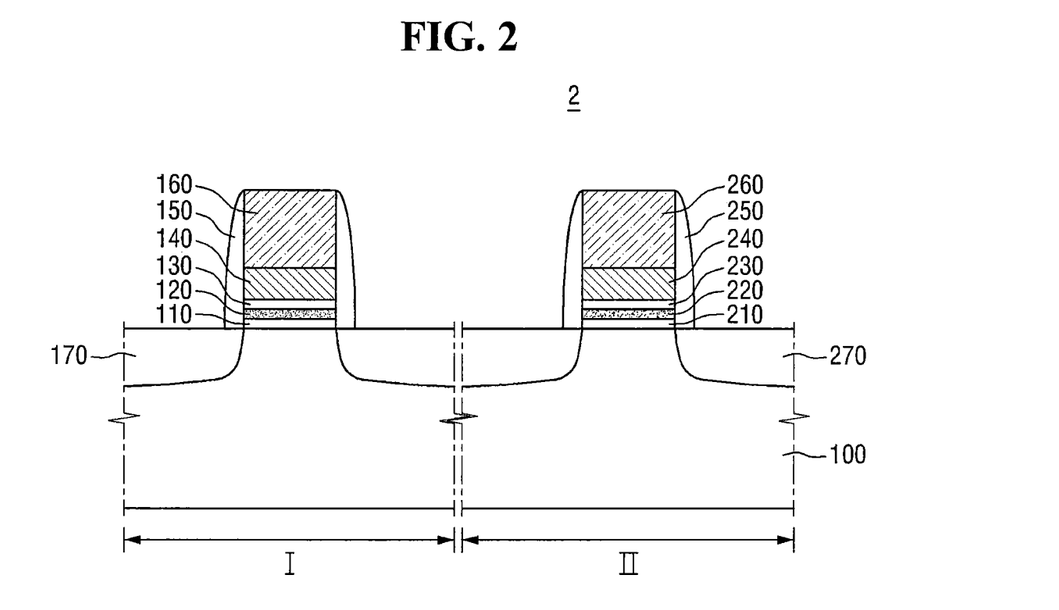
FIG. 2 is a cross-sectional view of a semiconductor device according to some embodiments of the inventive concept.

FIG. 2 is a cross-sectional view of a semiconductor device according to some embodiment of the inventive concept.

Referring to FIG. 2, a first region I and a second region II are defined in the substrate 100. An NMOS transistor may be formed in the first region I and a PMOS transistor may be formed in the second region II.

The NMOS transistor formed in the first region I may include a first interface film 110, a first gate insulation film 120, a first barrier film 130, first gate electrodes 140 and 160, and first source/drain 170.

The PMOS transistor formed in the second region II may include a second interface film 210, a second gate insulation film 220, a second barrier film 230, second gate electrodes 240 and 260, a second spacer 250, and a second source/drain 270.

The second interface film 210 may be formed of the same material as the first interface film 110 and may have the same thickness as the first interface film 110. For example, the second interface film 210 may include a silicon oxide film, a silicon oxynitride film, and silicate.

The second gate insulation film 220 may be formed on the second interface film 210 and may be a high-k film made of a material selected from the group consisting of $HfO_2$, $ZrO_2$, $Ta_2O_5$, $TiO_2$, $SrTiO_3$ and $(Ba,Sr)TiO_3$.

The second barrier film 230 may be formed on the second gate insulation film 220 and may be a material selected from the group consisting of HfON, HfSiON, ZrON and ZrSiON. For example, in a case where the second gate insulation film 220 is an $HfO_2$ film, the second barrier film 230 may be an HfSiON film.

The second gate electrodes 240 and 260 may include a stacked structure of a metal electrode 240 and a silicon electrode 260, but aspects of the inventive concept are not limited thereto.

The second source/drain 270 may be a p-type source/drain.

La may be included in the first gate insulation film 120 while La may not be included in the second gate insulation film 220. In addition, Al may be included in the second gate insulation film 220 while Al may not be included in the first gate insulation film 120. La adjusts a work function of an NMOS transistor and a threshold voltage (Vt), and Al adjusts a work function of a PMOS transistor and a threshold voltage (Vt). Therefore, operating characteristics of the NMOS transistor and the PMOS transistor can be improved.

La may not be included in the first barrier film 130 and Al may not be included in the second barrier film 230. In a case where La is included in the first barrier film 130 and Al is included in the second barrier film 230, there is an increased possibility of occurrence of leakage current.

Hereinafter, a fabricating method of the semiconductor device according to an embodiment of the inventive concept will be described with reference to FIGS. 2 and 3 to 8. FIGS. 3 to 8 illustrate intermediate process steps for explaining a fabricating method of the semiconductor device according to an embodiment of the inventive concept.

Figure 3:
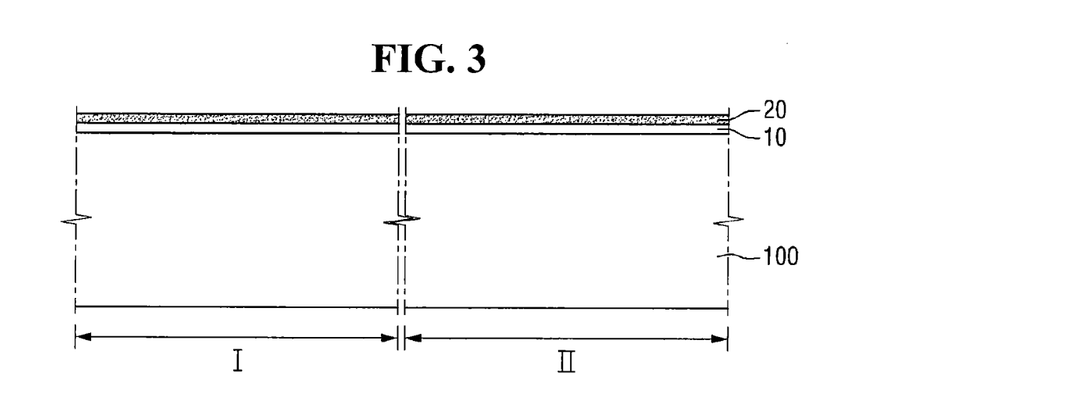
FIGS. 3 to 8 illustrate a method of fabricating a semiconductor device according to some embodiments of the inventive concept.

Referring to FIG. 3, the substrate 100 that has the first region I and the second region II is provided.

A material layer 10 for forming a first interface (110 of FIG. 2) and a second interface film (210 of FIG. 2) is formed on the substrate 100. As described above, the material layer 10 may include a silicon oxide film, a silicon oxynitride film, and silicate. For example, the substrate 100 may be washed by ozone gas or ozone water to form the material layer 10.

A first insulation film 20 for forming a first gate insulation film (120 of FIG. 2) and a second gate insulation film (220 of FIG. 2) is formed on the substrate 100. The first insulation film 20 may be made of a material selected from the group consisting of $HfO_2$, $ZrO_2$, $Ta_2O_5$, $TiO_2$, $SrTiO_3$ and $(Ba,Sr)TiO_3$.

The first insulation film 20 may be formed using, for example, ALD (atomic layer deposition), CVD (chemical vapor deposition), PECVD (plasma enhanced chemical vapor deposition), PVD (physical vapor deposition) and so on.

Figure 4:
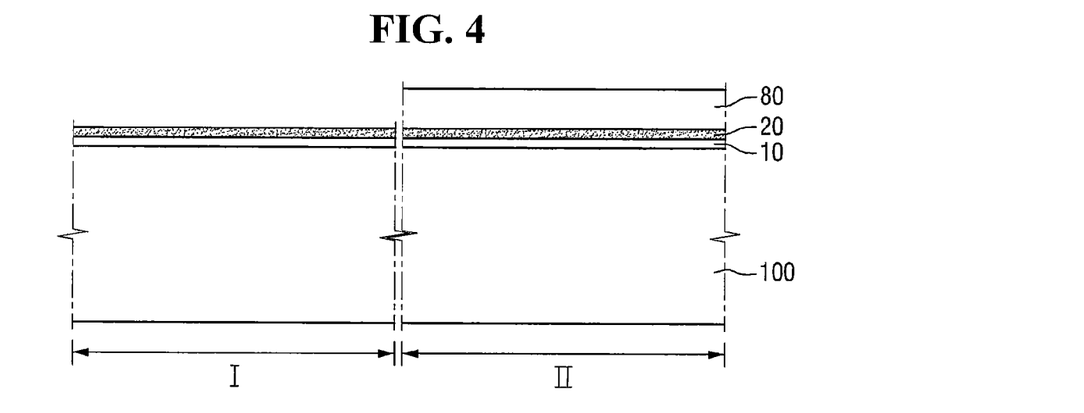

Referring to FIG. 4, a second work function adjusting layer 80 is formed on the first insulation film 20 of the second region II, while avoiding being formed on the first insulation film 20 of the first region I.

The second work function adjusting layer 80 may include a second material. The second material may include Aluminum (Al).

Forming the second work function adjusting layer 80 may include sequentially stacking a lower TiN film, an Al film, and an upper TiN film (that is, forming TiN/Al/TiN films). Alternatively, forming the second work function adjusting layer 80 may include sequentially stacking only the Al film and the upper TiN film without forming the lower TiN film (that is, forming Al/TiN films).

Forming the second work function adjusting layer 80 may be performed by ALD, CVD, PECVD, or PVD.

Figure 5:
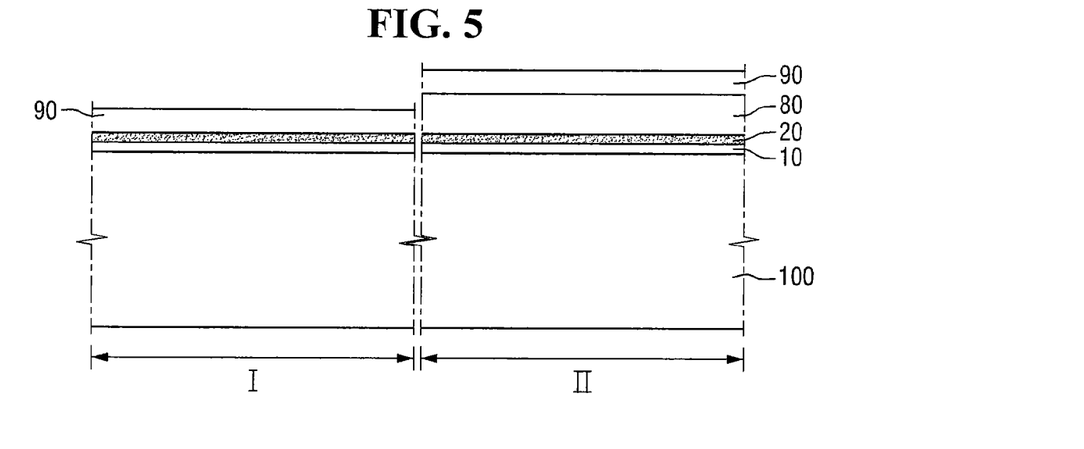

Referring to FIG. 5, a first work function adjusting layer 90 is formed on the first insulation film 20 of the first region I and on the second work function adjusting layer 80 of the second region II.

The first work function adjusting layer 80 may include a first material. The first material may include lanthanum (La).

Forming the first work function adjusting layer 90 may include sequentially stacking a LaO film and a TiN film (that is, forming LaO/TiN films). Alternatively, forming the first work function adjusting layer 90 may include sequentially stacking a LaO film, a TiN film, and a polysilicon film (that is, forming LaO/TiN/Si films).

Figure 6:
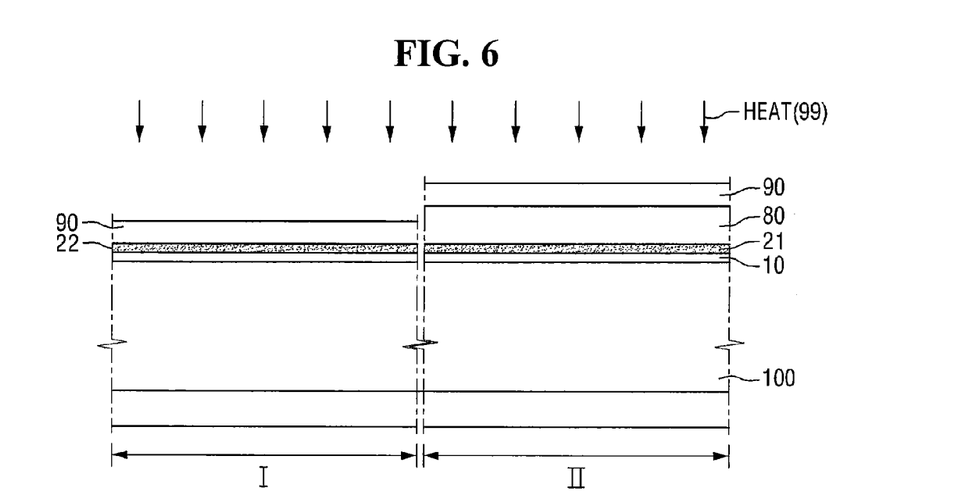

Referring to FIG. 6, annealing (99) is performed to diffuse the first material in the first work function adjusting layer 90 and the second material in the second work function adjusting layer 80 into the first insulation film 20.

The first material in the first work function adjusting layer 90 (i.e., La) is diffused into the first insulation film 20 of the first region I. The second material in the second work function adjusting layer 80 (i.e., Al) is diffused into the first insulation film 20 of the second region II. Here, since La may not penetrate the second work function adjusting layer 80, La may not be diffused into the first insulation film 21 of the second region II. As a result, La may be included in the first insulation film 22 of the first region I, and Al may be included in the first insulation film 21 of the second region II.

Figure 7:
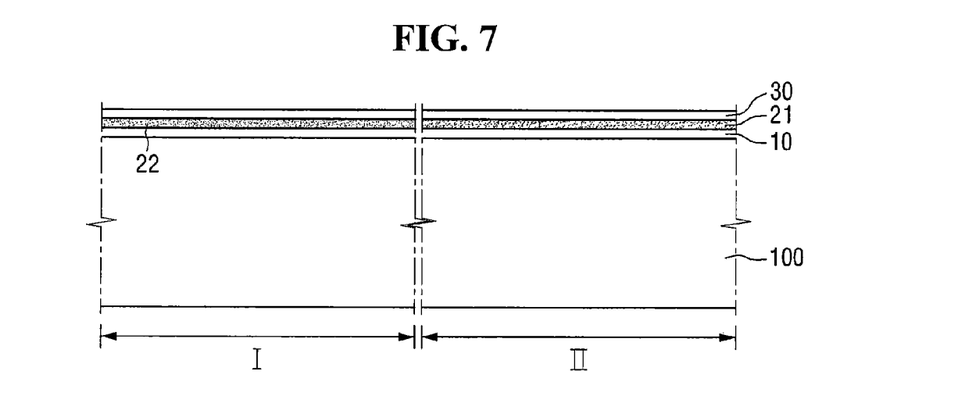

Referring to FIG. 7, the first work function adjusting layer 90 and the second work function adjusting layer 80 are removed, thereby exposing the first insulation films 21 and 22.

A second insulation film 30 for forming the first barrier film (130 of FIG. 2) and the second barrier film (230 of FIG. 2) is formed on the first insulation films 21 and 22. As described above, the second insulation film 30 may be selected from the group consisting of HfON, HfSiON, ZrON and ZrSiON.

The second insulation film 30 may be formed by ALD, CVD, PECVD, or PVD.

Figure 8:
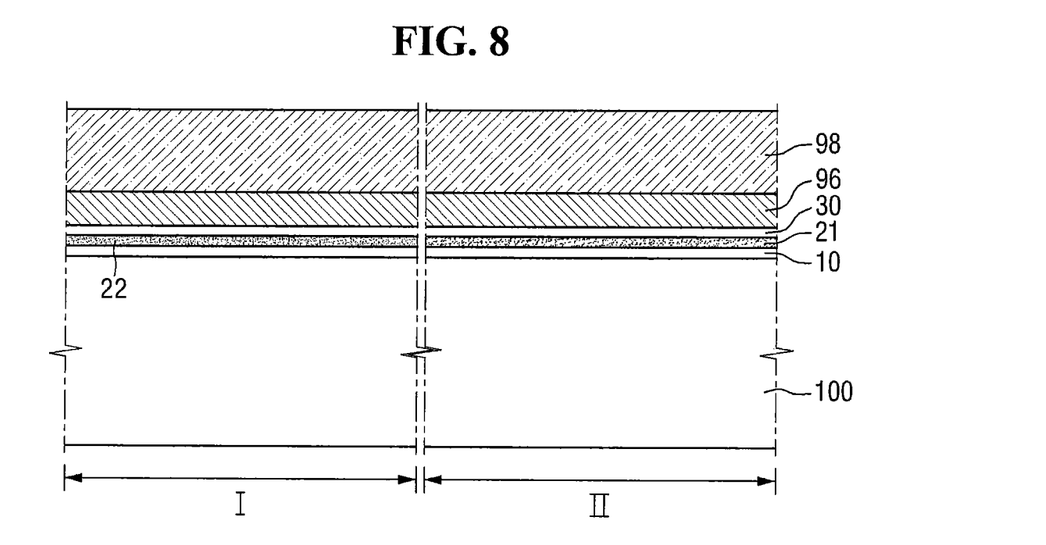

Referring to FIG. 8, material layers 96 and 98 for forming a gate electrode are formed on the second insulation film 30. In detail, the metal layer 96 for forming the metal electrodes (140 and 240 of FIG. 2) and the silicon layer 98 for forming the silicon electrodes (160 and 260 of FIG. 2) are formed on the second insulation film 30.

Referring again to FIG. 2, the material layers 96 and 98 for forming gate electrode, the second insulation film 30, and the first insulation films 21 and 22 are sequentially etched using an etching process.

As a result, the first interface film 110, the first gate insulation film 120, the first barrier film 130 and the first gate electrodes 140 and 160 are formed in the first region I. The second interface film 210, the second gate insulation film 220, the second barrier film 230 and the second gate electrodes 240 and 260 are formed in the second region II.

The first spacer 150 and the second spacer 250 are formed by a spacer forming process.

Before and/or after the spacer forming process, impurity is ion-implanted into the substrate 100, thereby forming the first source/drain 170 and the second source/drain 270.

Figure 9:
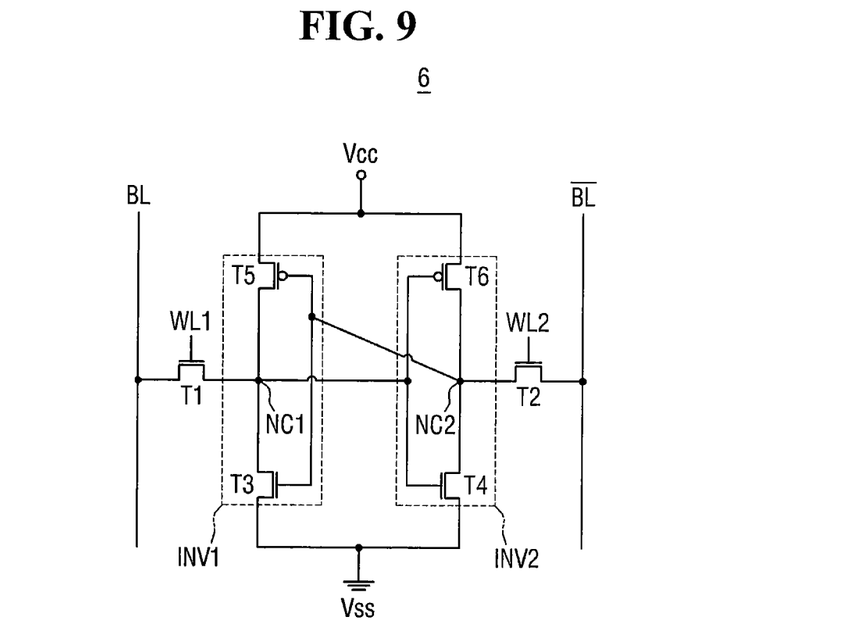
FIGS. 9 and 10 illustrate an exemplary SRAM employing a semiconductor device according to some embodiments of the inventive concept.
Figure 10:
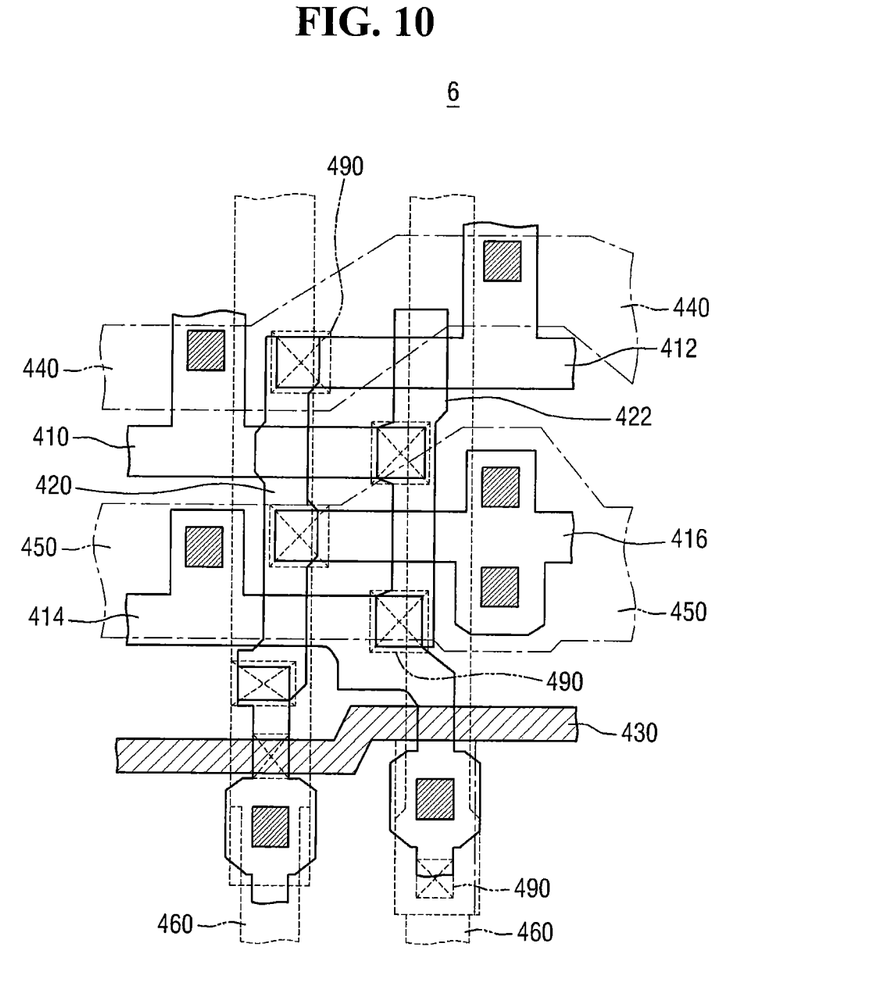

FIGS. 9 and 10 illustrate an exemplary SRAM employing a semiconductor device according to some embodiments of the inventive concept. The aforementioned semiconductor device according to some embodiments of the inventive concept and the fabricating method thereof can be applied to a semiconductor device using a high-k film and a fabricating method thereof. An exemplary SRAM device is illustrated in FIGS. 9 and 10.

Referring to FIG. 9, the SRAM device 6 may include a pair of inverters INV1 and INV2 connected in parallel between a power supply node Vcc and a ground node Vss, and a first transport transistor T1 and a second transport transistor T2 connected to output nodes of the inverters INV1 and INV2, respectively. The first transport transistor T1 and the second transport transistor T2 may be connected to a bit line BL and a complementary bit line /BL, respectively. Gates of the first transport transistor T1 and the second transport transistor T2 may be connected to word lines WL1 and WL2, respectively.

The first inverter INV1 may include a first load transistor T5 and a first driving transistor T3 connected in series, and the second inverter INV2 may include a second load transistor T6 and a second driving transistor T4 connected in series. The first load transistor T5 and the second load transistor T6 may be PMOS transistors, and the first driving transistor T3 and the second driving transistor T4 may be NMOS transistors.

In addition, in order to constitute a latch circuit, the first inverter INV1 and the second inverter INV2 are configured such that an input node of the first inverter INV1 is connected to the output node (NC2) of the second inverter INV2 and an input node of the second inverter INV2 is connected to the output node (NC1) of the first inverter INV1.

The NMOS transistors shown in FIGS. 1 and 2 may be employed to the first transport transistor T1, the second transport transistor T2, the first driving transistor T3 and the second driving transistor T4, and the PMOS transistors shown in FIG. 2 may be employed to the first load transistor T5 and the second load transistor T6.

Referring to FIGS. 9 and 10, reference numerals 410 and 412 denote active regions of PMOS transistors and reference numerals 414 and 416 denote active regions of NMOS transistors. Reference numerals 420 and 422 denote gate electrodes of first and second driving transistors T3 and T4, and reference numeral 430 denotes gate electrodes of the first and second transport transistors T1 and T2. Reference numeral 440 denotes a power supply line (Vcc line), reference numeral 450 denotes ground line (Vss line), reference numeral 460 denotes a bit line BL and a complementary bit line /BL, and reference numeral 490 denotes a metal contact.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A fabricating method of a semiconductor device, the fabricating method comprising:
    providing a substrate having a first region and a second region defined therein;
    forming a first insulation film on the substrate using a material selected from the group consisting of $HfO_2$, $ZrO_2$, $Ta_2O_5$, $TiO_2$, $SrTiO_3$ and $(Ba,Sr)TiO_3$;
    forming a second work function adjusting material on the first insulation film of the second region while not forming the second work function adjusting material on the first insulation film of the first region;
    forming a first work function adjusting material on the first insulation film of the first region and the second work function adjusting material of the second region;
    diffusing the first work function adjusting material and the second work function adjusting material by annealing;
    exposing the first insulation film by removing the first work function adjusting material and the second work function adjusting material; and
    forming a second insulation film on the exposed first insulation film using a material selected from the group consisting of HfON, HfSiON, ZrON and ZrSiON.

2. The fabricating method of claim 1, wherein Al is included in the second work function adjusting material.

3. The fabricating method of claim 2, wherein the forming of the second work function adjusting material comprises sequentially stacking a lower TiN film, an Al film and an upper TiN film.

4. The fabricating method of claim 1, wherein La is included in the first work function adjusting material.

5. The fabricating method of claim 4, wherein the forming of the first work function adjusting material comprises sequentially stacking a Lap film and a TiN film.

6. The fabricating method of claim 2, wherein the forming of the second work function adjusting material comprises sequentially stacking an Al film and a TiN film.

7. The fabricating method of claim 2, wherein the first work function adjusting material is free of Al.

8. The fabricating method of claim 4, wherein the second work function adjusting material is free of La.

9. The fabricating method of claim 1, wherein forming the first work function adjusting material comprises forming the first work function adjusting material directly on the second work function adjusting material of the second region.

10. The fabricating method of claim 1, wherein diffusing the first work function adjusting material and the second work function adjusting material comprises diffusing the first work function adjusting material into the first insulation film of the first region and diffusing the second work function adjusting material into the first insulation film of the second region.

11. The fabricating method of claim 10, wherein the first work function adjusting material comprises La, and
    wherein, after diffusing the first work function adjusting material and the second work function adjusting material, the first insulation film of the first region comprises La and the first insulation film of the second region is free of La.

12. The fabricating method of claim 10, wherein the second work function adjusting material comprises Al, and
    wherein, after diffusing the first work function adjusting material and the second work function adjusting material, the first insulation film of the second region comprises Al, and the first insulation film of the first region is free of Al.

* * * * *